United States Patent [19]
Welch et al.

[11] Patent Number: 5,384,797
[45] Date of Patent: Jan. 24, 1995

[54] MONOLITHIC MULTI-WAVELENGTH LASER DIODE ARRAY

[75] Inventors: David F. Welch; Robert G. Waarts, both of Palo Alto; Jo S. Major, San Jose; Ross D. Bringans, Cupertino; David K. Fork, Palo Alto; G. A. Neville Connell, Cupertino; Robert L. Thornton, East Palo Alto, all of Calif.

[73] Assignees: SDL, Inc., San Jose, Calif.; Xerox Corporation, Stamford, Conn. ; part interest to each

[21] Appl. No.: 949,452

[22] Filed: Sep. 21, 1992

[51] Int. Cl.⁶ ............... H01S 3/082; H01S 3/1055; H01S 3/109
[52] U.S. Cl. ........................ 372/23; 372/50; 372/22; 372/96; 385/122
[58] Field of Search .......... 372/50, 96, 102, 22, 372/23; 385/122; 359/328; 389/131, 132

[56] References Cited

U.S. PATENT DOCUMENTS

| | | | |
|---|---|---|---|
| 4,747,110 | 5/1988 | Takahashi et al. | 372/50 |
| 4,760,578 | 7/1988 | Oshima et al. | 372/50 |
| 4,802,182 | 7/1989 | Thornton et al. | 372/46 |
| 4,831,629 | 5/1989 | Paoli et al. | 372/50 |
| 4,925,811 | 5/1990 | Menigaux et al. | 437/129 |
| 4,951,293 | 8/1990 | Yamamoto et al. | 372/50 |
| 4,955,030 | 9/1990 | Menigaux et al. | 372/44 |
| 4,976,539 | 12/1990 | Carlson et al. | 372/96 |
| 4,982,408 | 1/1991 | Shimizu | 372/45 |
| 4,993,036 | 2/1991 | Ikeda et al. | 372/50 |
| 5,033,053 | 7/1991 | Shimizu et al. | 372/50 |
| 5,039,627 | 8/1991 | Menigaux et al. | 437/129 |
| 5,048,040 | 9/1991 | Paoli | 372/50 |
| 5,157,674 | 10/1992 | Lawandy | 372/22 |
| 5,157,680 | 10/1992 | Goto | 372/46 |
| 5,175,643 | 12/1992 | Andrews | 372/50 |
| 5,179,566 | 1/1993 | Iwano et al. | 359/328 |
| 5,185,752 | 2/1993 | Welch et al. | 372/22 |
| 5,307,359 | 4/1994 | Sarraf | 372/22 |

Primary Examiner—Rodney B. Bovernick
Assistant Examiner—Robert McNutt
Attorney, Agent, or Firm—Schneck & McHugh

[57] ABSTRACT

A monolithic multi-wavelength laser diode array having a composite active region of at least two dissimilar quantum well layers that are partially mixed in at least one of their constituent atomic species in at least one area of the active region. Different areas of the active region are characterized by different emission wavelengths determined by the degree of intermixing. An impurity free interdiffusion, such as vacancy enhanced interdiffusion, is used to provide the intermixing. Each area may have one or more waveguides and distributed Bragg reflector gratings tuned to the emission wavelength of the corresponding area of the active region. Each area or waveguide may also be separately pumped with an individually addressable current injection electrode. The laser output may be coupled into a ferroelectric frequency doubler integrally formed on the array substrate. The frequency doubler has periodically poled waveguides for quasi-phase matching in front of areas of the laser array emitting light which is to be doubled in frequency.

57 Claims, 3 Drawing Sheets

MONOLITHIC MULTI-WAVELENGTH LASER DIODE ARRAY

TECHNICAL FIELD

The present invention relates to monolithically integrated semiconductor laser diode arrays of the type producing plural output beams of different wavelengths.

BACKGROUND ART

Addressable monolithic multi-wavelength light sources, especially laser arrays that can simultaneously emit different wavelength light from different elements in the array are useful in a variety of applications, such as color printing, full color digital film recording, color displays, and other optical recording system applications.

In U.S. Pat. Nos. 4,925,811, 4,955,030 and 5,039,627, Menigaux et al. describe various terraced semiconductor layer structures having stacks of alternate confinement layers and active layers. Each active layer in the stack has a different composition and is capable of emitting light of a different wavelength. A desired number of laterally spaced PN junctions are formed by localized introduction and diffusion of a p-type impurity, the different PN junctions being made in the vicinity of different active layers in the stack. The resulting structures can emit, either simultaneously or independently, as desired, different wavelength light beams from the array.

In U.S. Pat. No. 4,831,629, Paoli et al. describe laser arrays that are characterized by nonuniform current pumping across the arrays. The nonuniform current distribution among the several laser emitters of the array is brought about, for example, by different current confinement or stripe widths or by some other nonuniform contact configuration. The different pump current and carrier densities across the array result in different increments of band filling in the active region's quantum well structure, thereby causing individual laser emitters to operate at different emission wavelengths.

In U.S. Pat. No. 4,993,036, Ikeda et al. describe a semiconductor laser array having a double quantum well active region in which the two quantum well layers have different energy gaps, and, consequently, different oscillation wavelengths. There are also provided two adjacent pairs of grating reflectors, each pair having a grating pitch that is tuned to reflect a different one of the two oscillation wavelengths of light. Arrays having more than two quantum well layers, each with a different energy gap, and having more than two sets of wavelength selective reflectors, are also suggested.

In U.S. Pat. No. 4,951,293, Yamamoto et al. describe a semiconductor laser and a frequency doubling optical nonlinear device, both mounted on a submount to form a visible laser source. The nonlinear device can have a plurality of parallel waveguides for receiving light beams from a semiconductor laser array.

An object of the invention is to provide monolithic multi-wavelength semiconductor laser arrays.

DISCLOSURE OF THE INVENTION

The above object has been met with a laser diode array having a semiconductor material body with a plurality of contiguous semiconductor layers forming a heterostructure. The heterostructure includes a composite active region made up of two or more adjacent quantum well layers of dissimilar material. The composite active region is partially disordered by an impurity free interdiffusion of atomic constituents of the quantum well layers so as to shift the emission wavelength of the active region. Different areas of the active region in the laser diode array are disordered to different degrees so that these different areas have different emission wavelengths. Each area may have one or more waveguides and distributed Bragg reflector (DBR) gratings tuned to the emission wavelength in that area for providing feedback in a resonant cavity. Further, each different area of the active region or each waveguide may be electrically pumped by a separate, individually addressable, current injection means.

The impurity free interdiffusion may be produced by a vacancy-enhanced interdiffusion technique in which a capping structure is formed on the wafer surface with native vacancies therein. In group III-V compound semiconductors, preferential formation of either group III vacancies (or group V vacancies) in the cap will cause preferential interdiffusion of group III atoms (or group V atoms) in the active region when the vacancies are caused to migrate, such as by thermal diffusion. The interdiffusion may result in gain-enhancing strain in a formerly lattice matched active region.

The object is further met in a laser diode array that includes a ferroelectric layer structure epitaxially grown on the same substrate as the monolithic array of laser oscillators to double the frequency of light emitted from at least one of the laser oscillators. A preferred embodiment comprises a $Ca_xSr_{1-x}F_2/LiTaO_3/Ca_xSr_{1-x}F_2$ layer structure with an array of $LiTaO_3$ waveguides. Those waveguides intended for frequency doubling are periodically poled, preferably using first order quasi-phase matching. A power amplifier array between the laser oscillator array and ferroelectric waveguide array amplifies the optical power from the laser for efficient harmonic conversion in the periodically poled waveguides.

BEST MODE FOR CARRYING OUT THE INVENTION

Figure 1:
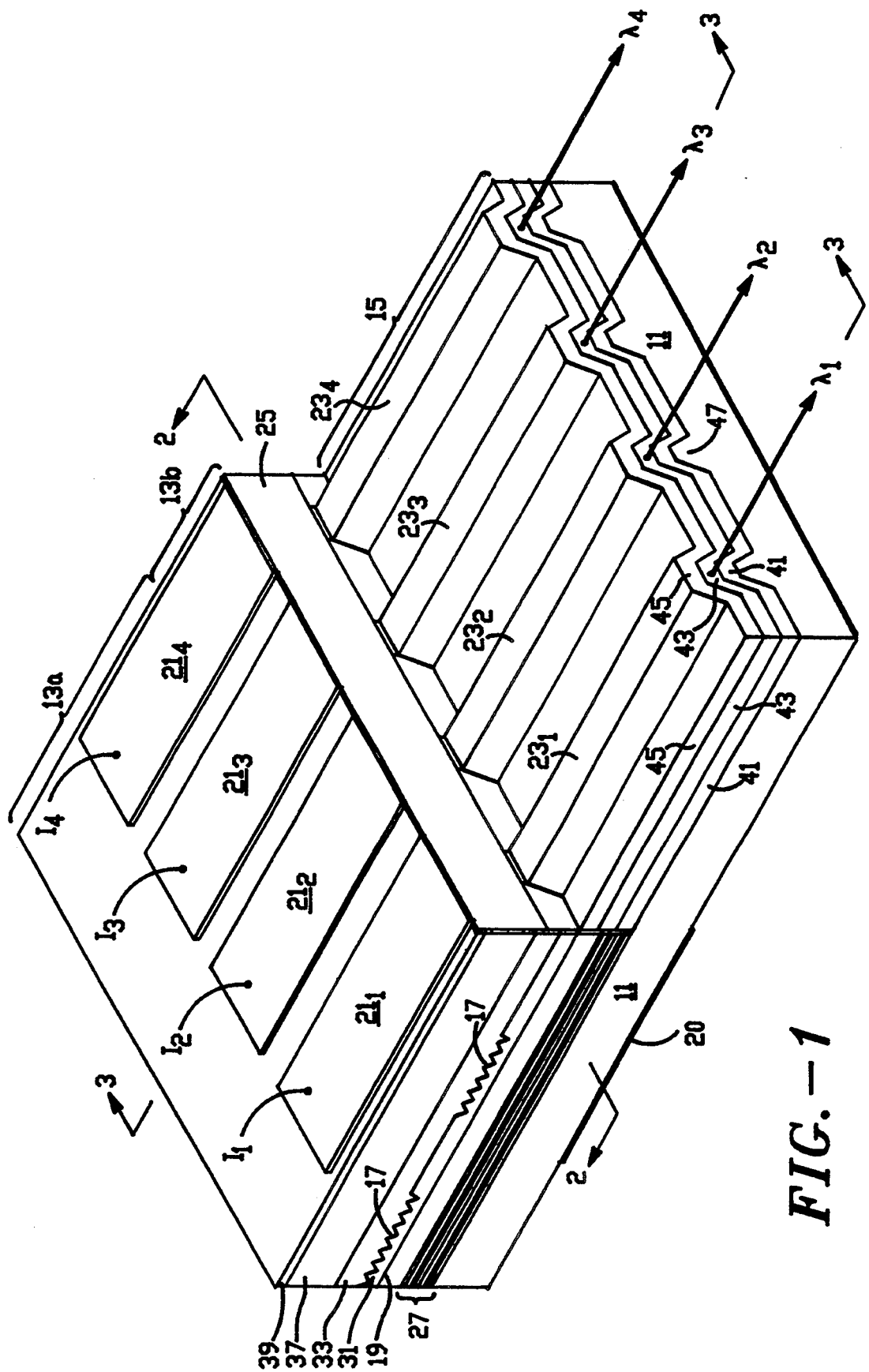
FIG. 1 is a perspective view of a preferred laser diode array embodiment of the present invention.

With reference to FIG. 1, a monolithic multi-wavelength laser array of the present invention includes a laser active region 19 in a semiconductor heterostructure in which the emission energy has been varied laterally across the array by partially disordering the composite quantum well in selected areas, resulting in emission wavelengths that can range from 630 nm to 1.1 $\mu$m.

The laser array typically also includes arrays of front and rear distributed Bragg reflector (DBR) gratings 17 that have been fabricated with grating periods selected to match the various different gain peaks of the individual emission bands of the active region in the array, resulting in an array of laser oscillators 13a characterized by single longitudinal mode emission from each of the gain regions in the array. An amplifier array 13b may be used to amplify the output of the DBR master oscillators 13a to high power outputs. A patterned p-metallization $21_1$–$21_4$ individually addresses the DBR master oscillators 13a and amplifier array 13b with selected injected currents $I_1$–$I_4$. The array can have a center-to-center separation as close as 10 μm.

In addition to having a multi-wavelength master oscillator and power amplifier array grown monolithically on the same substrate 11, the embodiments of the invention can also include epitaxially grown ferroelectric material 15 for doubling the frequency of at least one of the outputs from the power amplifier array 13b. The frequency doubling material 15 includes an array of self-aligned waveguides $23_1$–$23_4$ therein to minimize coupling losses between the power amplifier 13a and frequency doubling material 15. Waveguides $23_3$ and $23_4$ in which frequency doubling is intended to take place are preferably periodically poled to efficiently convert the fundamental radiation received from the amplifier array 13b into the second harmonic frequency.

With reference to FIG. 4, the addressable monolithic multi-wavelength laser diode array of the present invention is based on a composite quantum well structure for the active region in which the emission band is adjustable during manufacture of the laser array by partially disordering the quantum well via the mechanism of vacancy-enhanced interdiffusion. This mechanism differs from that of impurity induced disordering in that vacancy-enhanced interdiffusion is an impurity-free technique, so the band structure of the disordered quantum well is not damaged and high quality optical emission properties are retained. In the vacancy-enhanced interdiffusion technique a capping structure is formed on the semiconductor wafer surface. This cap, depending on how it is made, results in the preferential formation of either group III or group V vacancies at the wafer surface in group III-V compound semiconductor materials. For example, if the cap is epitaxially grown with a slight excess of group V atomic species, then vacancies will be created in the group III sublattice of the compound semiconductor crystal making up the cap. Vacancies and other native point defects, such as interstitials, are important to the mechanism for atomic interdiffusion. Migration of native vacancies through one of the sublattices results in the interdiffusion of the elements in that sublattice. Heating the semiconductor wafer will cause diffusion of vacancies formed at the wafer surface into the heterostructure and will cause interdiffusion of elements across layer boundaries. Capping conditions that result in preferential formation of group III vacancies at the surface cause a much greater interdiffusion of the group III elements at the quantum well relative to the group V elements. The converse is true when the cap results in preferential formation of group V vacancies at the surface. The diffusion rates in the group III and group V sublattices have been found to differ by two orders of magnitude when the material is capped to enhance migration of one group of elements over the other.

Figure 4B:
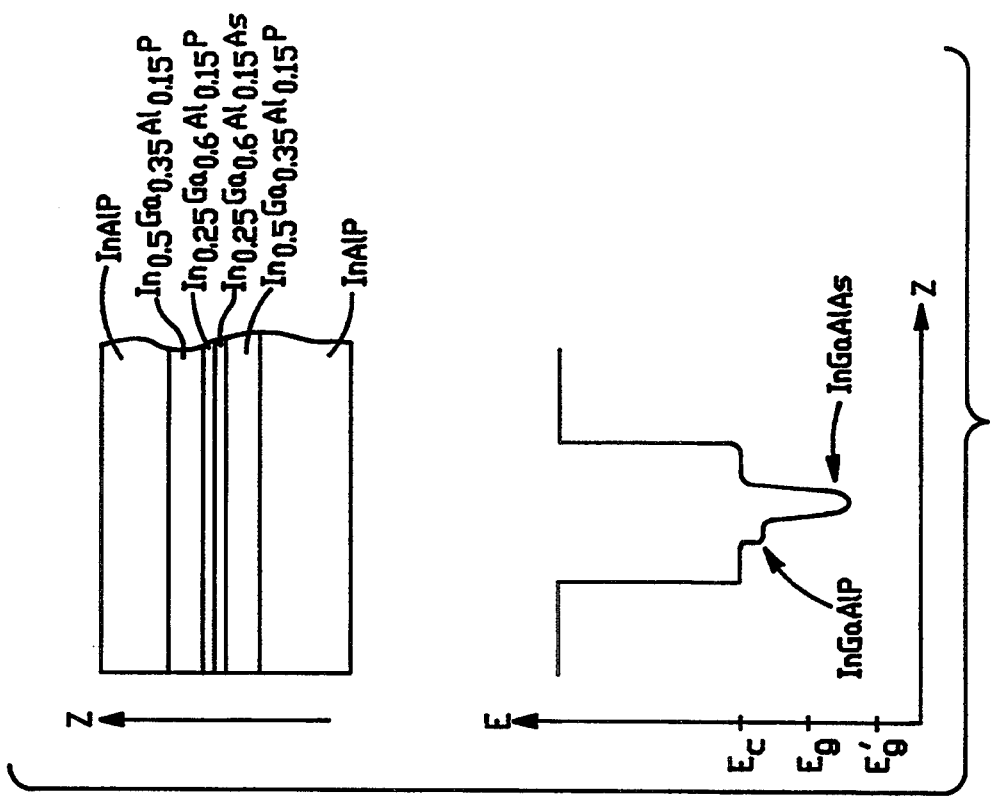
FIG. 4b is an enlarged side view and corresponding graph, analogous to FIG. 4a, for a heterostructure that has been disordered in accord with the present invention.
Figure 4A:
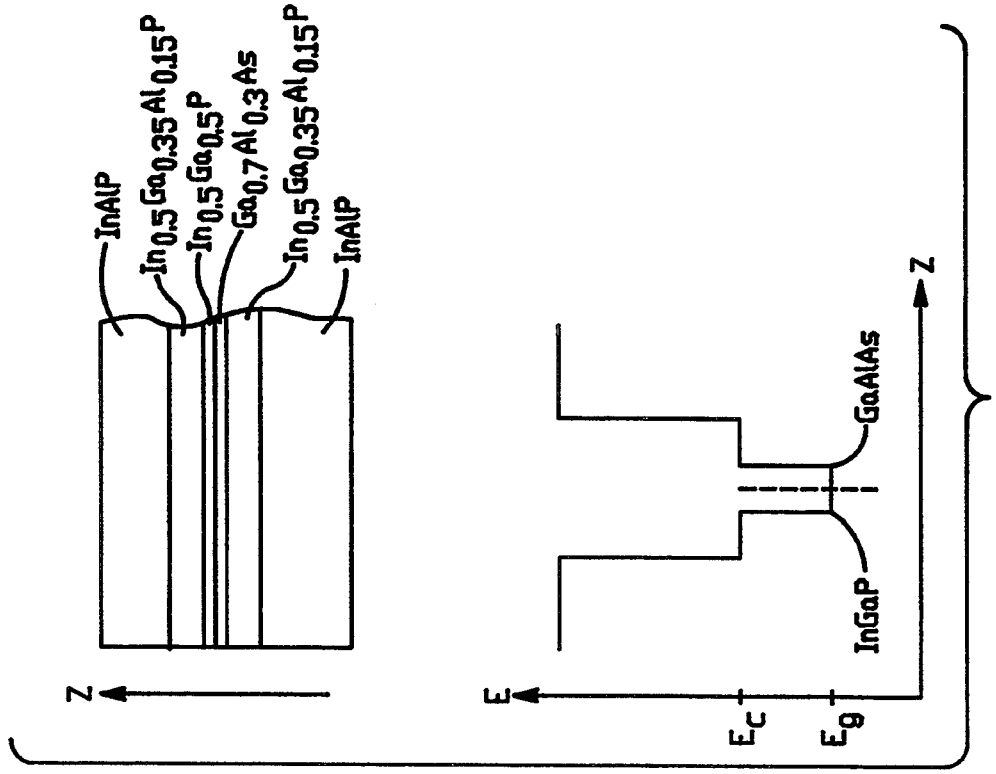
FIG. 4a is an enlarged side view of a heterostructure for the laser diode array of FIG. 1 prior to disordering in accord with the present invention, and a corresponding graph of the heterostructure's energy band structure in terms of energy gap E versus depth Z within the heterostructure.

In FIG. 4a, one possible formulation of the semiconductor heterostructure prior to disordering consists of a composite quantum well active region with both a $Ga_{0.7}Al_{0.3}As$ layer growth and a $In_{0.5}Ga_{0.5}P$ layer growth. The composition has been selected so that both layers are lattice matched to each other and to the GaAs substrate, and further so that both layers have an identical bandgap Eg (=1.97 eV) and an identical emission wavelength of 630 nm. Other compositions could also be selected. The composite quantum well is embedded in a separate confinement heterostructure consisting of $In_{0.5}Ga_{0.35}Al_{0.15}P$ confining layers and $In_{0.5}Al_{0.5}P$ cladding layers. The cladding layers have a higher bandgap and lower refractive index than the confining layers, which in turn have a higher bandgap Ec than the composite quantum well.

In FIG. 4b, the quantum well has been disordered via preferential interdiffusion of the group III elements. At the point where the atomic gradient for each individual specie vanishes, the $Ga_{0.7}Al_{0.3}As$ layer has become $In_{0.25}Ga_{0.6}Al_{0.15}As$ and the $In_{0.5}Ga_{0.5}P$ layer has become $In_{0.25}Ga_{0.6}Al_{0.15}P$. The confinement and cladding layer compositions are substantially unchanged, although some intermixing may occur locally at the layer boundaries. The electron energy band structure has been modified by the interdiffusion, such that the band gap for the InGaP layer has been increased in the InGaAlP layer to near the band gap Ec for the confinement layers, and such that the band gap for the GaAlAs layer has been decreased in the InGaAlAs layer now present to a new band gap Eg'. For $In_{0.25}Ga_{0.6}Al_{0.15}As$, this band gap Eg' is about 1.32 eV, corresponding to an emission wavelength of 940 nm.

If, instead of a group III elemental interdiffusion, a capping condition is created to enhance interdiffusion of the group V elements, then at the point where the atomic gradients in the quantum well layers disappear, the layer compositions are $In_{0.5}Ga_{0.5}As_{0.5}P_{0.5}$ and $Ga_{0.7}Al_{0.3}As_{0.5}P_{0.5}$. The first of these two intermixed quantum well layers has a band gap of 1.38 eV corresponding to an emission wavelength of 900 μm.

The relative diffusion rates of the group III (or group V) elements are determined not only by the atomic gradients for each individual specie, but also by the heat of formation of the various bonds. This latter factor has not previously been an issue for the interdiffusion of group III atoms in disordering conventional GaAlAs heterostructures, because in such cases the type of bonding is invariant with respect to lattice location. That is, in GaAlAs heterostructures, all group III atomic bonds are to arsenic atoms, the only specie present in the group V sublattice. However, in an InGaP/GaAlAs material system, such as the epitaxial layer structure in FIG. 4a, atoms migrating within the group III sublattice can exchange arsenic and phosphorus bonds, producing a change in total bond energy. If an atom gains a sufficient amount of energy by exchanging a phosphorus bond for an arsenic bond, it becomes possible to observe atomic migration or diffusion against the atomic concentration gradient. Via this mechanism, the GaAlAs layer in the composite quantum well active region can be driven to a composition of InGaAlAs in which the concentration of indium is greater than 0.25 and the concentration of gallium is less than 0.6. A band gap less than 1.1 eV and an emission wavelength longer than 1100 nm can be achieved.

Wavelengths between 630 nm and 1100 nm can be produced in areas of the active region which are only partially disordered, instead of being interdiffused to completion. Thus, by controlling the degree of disordering, intermediate emission wavelengths can be obtained. Selective disordering can produce different wavelength emission bands in adjacent areas of the array so that a monolithic multi-wavelength laser array can be constructed. Heterostructures could also be designed to promote intermixing between the quantum well layers and the adjacent confinement layers, so that partial disordering causes a shift toward shorter emission wavelengths, instead of the shift from 630 nm to longer wavelengths up to 1100 nm.

Vacancy-enhanced disordering, by interdiffusing the group III (or group V) elements in the quantum well layers, produces a lattice mismatch that induces a compressive strain in the quantum well. In the case of referential group III interdiffusion in which the constituents have been interdiffused to the point where the atomic gradients vanish, as in the example given above in FIG. 4$b$, the associated strain is $\Delta a/a = 1.8\%$. This compressive strain of the active region causes a reduction in the valence band effective mass, resulting in closer symmetry of the conduction and valence bonds, and thereby enhancing the transition probability and increasing the quantum conversion efficiency. The strain has been shown to reduce the threshold current and increase the gain of the quantum well by as much as a factor of two. The critical thickness corresponding to a 1.8% layer strain due to a lattice mismatch is approximately 12 nm. For quantum well thicknesses less than this critical thickness, the material does not develop any associated dislocations. In fact, the reliability of lasers with a strained active region less than the critical thickness has been found to be greater than those with lattice matched active regions. Consequently, the disordered and partially disordered active regions in the heterostructures of the present invention have high gain and high reliability.

Figure 2:
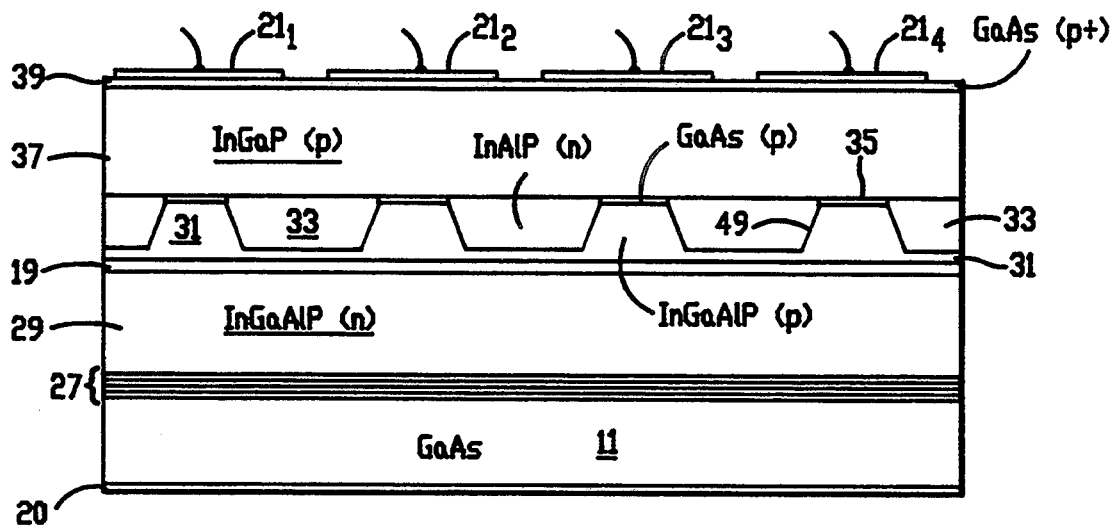
FIG. 2 is a sectional view taken along the lines 2—2 in FIG. 1.

Referring to FIG. 2, the heterostructure forming the multi-wavelength master oscillator power amplifier array of the present invention includes a p-type InGaAlP confinement and first upper cladding layer 31 epitaxially grown on top of the composite quantum well 19. Layer 31 may be selectively etched to form a mesa structure made up of multiple laterally spaced apart unetched mesa regions 49 separated by etched regions. A 10 μm center-to-center spacing between mesas 49 is typical. An InAlP cladding layer 33 is then grown over the InGaAlP confinement layer 31, filling the regions between the mesas 49. The presence of the InAlP cladding regions 33 results in a real refractive index waveguide array that substantially confines light propagation in the quantum well active region 19 and confinement layers 29 and 31 to those areas coinciding with the mesas 49. The InAlP cladding layer 33 may be n-type material, confining current solely to the mesa regions 49. A p-type GaAs layer 35 may be deposited on top of each mesa 49. Additionally, a final InGaP cladding layer 37 and a GaAs cap layer 39 may be deposited over the InAlP cladding layer 33 and GaAs layer 35. The index guides in the resulting heterostructure stabilize each laser emitter in the array in a single spatial mode and minimize threshold current for lasing operation. Other layer structures could be used in combination with the partially disordered composite quantum well active region 19 of the present invention to produce alternative multi-wavelength laser array embodiments.

Figure 3:
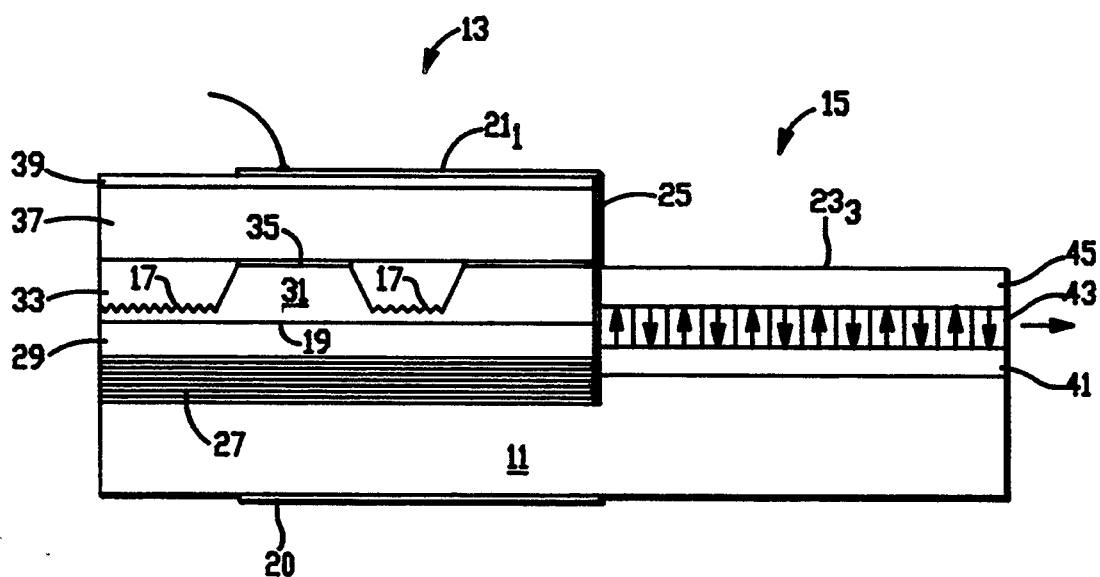
FIG. 3 is a side elevational view of the laser diode array embodiment in FIG. 1.

As seen in FIGS. 1 and 3, the structure also includes arrays of front and rear distributed Bragg reflector (DBR) gratings 17 for feedback of light in the associated gain region 19 of the laser oscillator array 13$a$. Typical reflectivities for the front and rear gratings 17 are 20% and 50% respectively. Because it is difficult to directly expose the short grating pitches needed to make first order gratings in short wavelength materials, second order gratings are preferred. The pitch of each grating 17 in the array is tuned to the emission wavelength of the associated gain region, as determined by the extent of partial disordering of the composite quantum well 19. The gratings may be fabricated between the InGaAlP confinement layer 31 and the InAlP cladding layer 33 onto portions of the confinement layer 31 at the front and rear of the mesa waveguides 49 for the laser oscillator array 13$a$. Preferably, these grating areas coincide with thinner etched regions of the confinement layer 31, like the filled regions on the sides of mesa structures 49 in FIG. 2, for maximum grating coupling efficiency, and are likewise filled with InAlP cladding layer material 33. A superlattice reflector 27 composed of many thin semiconductor material layers of alternating refractive indices may be formed between the substrate 11 and the n-type cladding and confining layer or layers 29. The superlattice reflector 27 reflects any light that might be diffracted by the second order gratings 17 into the substrate 11 back toward the gratings 17, where the light can be rediffracted back into the waveguides, thereby minimizing diffractive losses of the second order gratings 17. Preferably, the position of the superlattice reflector 27 relative to the gratings 17 is chosen so that the phase of the reflected light is such that it destructively interferes with the p-side radiation, further reducing the diffractive losses. Because of the multi-wavelength nature of this invention, embodiments that employ a superlattice reflector 27 require different layer thicknesses for each of the laser oscillators 13$a$ in the array. Use of the superlattice reflector 27 allows the efficiency of the second order gratings 17 to approach that of first order gratings.

The output of the DBR laser oscillator is injected into a power amplifier array 13$b$. The optical power received by the power amplifier array 13$b$ from the multi-wavelength laser oscillator array 13$a$ is amplified high power, typically at least 300 mw, without changing the emission wavelengths. Each element of the amplifier array 13$b$ employs a quantum well active region 19 that is disordered to the same degree as the corresponding element in the laser oscillator array 13$a$. Mesa waveguides 49 used by the amplifier array 13$b$ are collinear with corresponding mesa waveguides 49 in the laser oscillator array 13$a$. A length of 500 μm for each of the laser oscillator and power amplifier portions is typical. The front end of the amplifier array 13$b$ is preferably antireflection coated with a silicon oxide coating layer 25 to reduce reflectivity to about 0.1% or less. The coating thickness may vary for each element of the array to maintain a $\frac{1}{4}$ wavelength thickness for each wavelength of light emitted from the laser-amplifier array 13.

In FIGS. 1 and 3, the device includes ferroelectric frequency doubling material 15 epitaxially grown on the substrate 11 for doubling the frequency (halving the wavelength) of light emitted from at least one of the amplifier array elements. The frequency doubling material 15 is a three layer epitaxial growth consisting of a 0.15 μm thick $Ca_xSr_{1-x}F_2$ buffer layer 41 deposited on the (111) surface of the GaAs substrate, a 0.30 μm thick LiTaO$_3$ waveguide layer 43 deposited on top of layer 41 and a 0.15 μm thick Ca$_x$Sr$_{1-x}$F$_2$ cladding layer 45 deposited on top of layer 43. The composition of the Ca$_x$Sr$_{1-x}$F$_2$ buffer layer 41 is preferably graded to match the lattice constants of the GaAs substrate surface and the LiTaO$_3$ waveguide layer 43. x=0.43 at the substrate 11. The upper cladding 45 need not be epitaxial, but merely be of lower refractive index than the waveguide core 43 and smooth, such as a glass film material. Other frequency doubling layer structures, such as MgO/BaTiO$_3$/MgO deposited on a (100) GaAs substrate surface, could also be used.

The Ca$_x$Sr$_{1-x}$F$_2$ layers 41 and 45 have a lower refractive index than the LiTaO$_3$ layer 43, so transverse waveguiding of the light received from the amplifier array 13b takes place, with peak optical intensity in the waveguide layer 43. The mode size for the fundamental frequency is about 0.6 μm (measured at the 1/e$^2$ points) for the layer thicknesses given above, matching the mode size defined by the layers 29, 19, 31 and 33 in the amplifier array 13b. The lateral mode of the LiTaO$_3$ waveguides are defined by growing the layers 41, 43 and 45 over a ridge structure 47 formed in the substrate 11. The ridges 47 are formed by selective etching of the substrate 11 at the same time that the p-type InGaAlP confinement layer 31 is etched to form the mesas 49 for the waveguides of the laser-amplifier array 13. As a result, the LiTaO$_3$ waveguides 23$_1$-23$_4$ are self-aligned with the several light outputs from the amplifier array 13b. The waveguide layer 43 in the regions above the ridges 47 is further aligned with the plane of the quantum well active region 19. Together with the presence of an antireflection coating 25 between the amplifier array 13b and frequency doubling material 15, the self-alignment of the LiTaO$_3$ waveguides 23$_1$-23$_4$ maximizes coupling (about 90% or higher) into the waveguides 23$_1$-23$_4$, resulting in at least 275 mW of optical power being launched into the frequency doubling material 15.

At least one of the LiTaO$_3$ waveguides 23$_1$-23$_4$ is periodically poled to cause efficient frequency conversion of the received lightwaves. The conversion is generally most efficient when TM polarized light (with the electric field oriented in the plane of the frequency doubling layer) is received from the laser-amplifier array. For LiTaO$_3$ material, the appropriate nonlinear coefficient d$_{33}$ is −17 pm/V. However, TE polarized light (with the electric field oriented normal to the plane of the frequency doubling material) can also be doubled in frequency, albeit with lower conversion efficiency. For LiTaO$_3$ material, the appropriate nonlinear coefficient in this case, d$_{31}$ is −1.47 pm/V. In FIG. 1, waveguides 23$_3$ and 23$_4$ are periodically poled, while waveguides 23$_1$ and 23$_2$ are left unpoled and act as low loss waveguides transmitting the fundamental radiation. For example, waveguides 23$_1$ and 23$_2$ may emit output beams with two different wavelengths λ$_1$ and λ$_2$ in the range from 630 nm to 1100 nm, depending on the extent of disordering in the quantum well active region 19 in the corresponding portions of the laser-amplifier array 13. Likewise, waveguides 23$_3$ and 23$_4$ may emit output beams with two different wavelengths λ$_3$ and λ$_4$ in the range from 430 nm to 550 nm. These latter wavelengths λ$_3$ and λ$_4$ are produced by doubling the frequency of the light emitted from the corresponding portions of the laser-amplifier array 13, such light prior to frequency doubling having fundamental wavelengths in a range from 860 nm to 1100 nm, again depending on the extent of disordering of the quantum well active region 19. While frequency doubling is generally preferred, because second harmonic generation by the ferroelectric material is relatively efficient, other frequency harmonics of the light, such as third or higher harmonics and even half-order harmonics, could also be generated to produce frequency tripling and the like, albeit with lower conversion efficiency.

The LiTaO$_3$ layer 43 is grown on its crystal orientation aligned so that the c-axis is normal to the growth plane. Domain reversals in the LiTaO$_3$ material are accomplished by using an electrode pattern to apply an electric field perpendicular to the c-axis at temperatures elevated to near the Curie temperature T$_c$ of the material. For LiTaO$_3$, T$_c$=604° C. This temperature is compatible with GaAs processing. By applying the electric field, the domains become aligned and the sign of the nonlinear coefficient for light interacting with ferroelectric material is periodically reversed, enabling quasi-phase matching to be achieved.

For quasi-phase matching the periodicity of the domain reversals is $$L_c = \frac{p\lambda}{4(n_{2w} - n_w)},$$

where p is an odd integer representing the matching order, λ is the wavelength of the fundamental lightwave, and n$_w$ and n$_{2w}$ are refractive indices of the ferroelectric material at the fundamental and second harmonic (frequency doubled) wavelengths. For third order quasi-phase matching (p=3), L$_c$ is approximately 11 μm for LiTaO$_3$. For first order quasi-phase matching (p=1), L$_c$ is approximately 4 μm for LiTaO$_3$. First order quasi-phase matching is preferred whenever fabrication tolerances allow it to be used, because the nonlinear coefficient is three times greater in the first order as compared to the third order. Thus, the doubling efficiency is nine times greater in the first order. The principal factor limiting use of first order quasi-phase matching in frequently doubling materials is the certainty or uncertainty in the domain boundaries. In order to avoid washout of the relatively short poled domains needed for first order quasi-phase matching, the domain boundaries need to be sharp, i.e., the domain reversals need to be abrupt. The abruptness that can be achieved is a consequence of the abruptness of the opposing electric field lines applied to adjacent domains of the ferroelectric material. In order to accommodate abrupt domain reversals, the electrode patterns are deposited to form opposing field lines in adjacent domains, minimizing the electric field gradient. Further, in the three layer Ca$_x$Sr$_{1-x}$F$_2$/LiTaO$_3$/Ca$_x$Sr$_{1-x}$F$_2$ structure monolithically integrated on the GaAs substrate, as described above, the waveguide dimension is only 0.6 μm, which is small compared to the coherence length of the laser light. Thus, the abruptness of the domain boundaries can be accurately controlled throughout the entire depth of the waveguide. Together with the improvements in injected power, and the use of DBR laser oscillators 13a in the array to avoid longitudinal mode hops and maintain frequency matching to the resonance of the periodically poled waveguides, the conversion efficiency can be as much as 30%, thereby providing up to 80 mW of output power in the blue/green wavelengths (430 nm to 550 nm).

We claim:

1. A light emitting device comprising,
   a substrate,
   a plurality of contiguous semiconductor layers disposed on said substrate, said layers forming a diode heterostructure optical gain medium with a composite active region of at least two adjacent lower bandgap layers together sandwiched between higher bandgap barrier layers defined in at least a portion of said heterostructure gain medium, said at least two adjacent lower bandgap layers of said composite active region having been formed from adjacent quantum well layers that were subsequently at least partially intermixed in at least one of their atomic species to a selected degree in at least one area of said composite active region, the degree of intermixing between said quantum well layers in said at least one area of said composite active region determining, in at least one of the resultant adjacent lower bandgap layers formed by the intermixing, a wavelength band for generation of lightwaves propagating in that area, and
   means for pumping each area of said active region.

2. The device of claim 1 wherein said at least two adjacent lower bandgap layers of said composite active region have been formed from adjacent group III-V compound semiconductor material quantum well layers of dissimilar composition but similar bandgap, the resultant adjacent lower bandgap layers also having dissimilar composition but more dissimilar bandgaps.

3. The device of claim 2 wherein said at least one partially intermixed area of said at least two adjacent lower bandgap layers of said active region is intermixed in its constituent group III atomic species.

4. The device of claim 2 wherein said at least one partially intermixed area of said at least two adjacent lower bandgap layers of said active region is intermixed in its constituent group V atomic species.

5. The device of claim 1 wherein said at least one area of said composite active region is optically coupled to a light source to receive therefrom lightwaves having a wavelength within said wavelength band of said area, said optical gain medium thereby forming an optical power amplifier for said received lightwaves.

6. The device of claim 1 wherein plural areas of said composite active region are optically coupled to at least one light source to receive therefrom lightwaves having one or more wavelengths corresponding to the wavelength band in each said area, said optical gain medium thereby forming an amplifier array for said received lightwaves.

7. The device of claim 6 wherein said at least one light source is a laser array.

8. The laser diode array of claim 6 wherein said means for pumping is individually addressable of each area of said active region.

9. The device of claim 1 further comprising resonant cavity means for providing feedback for each area of said composite active region of lightwaves generated in each said area, said optical gain medium thereby forming a laser oscillator.

10. The device of claim 9 further comprising lateral waveguiding means defined in plural areas of said composite active region for guiding lightwave propagation within said areas, said optical gain medium thereby forming a laser array.

11. The device of claim 10 wherein different areas of said composite active region have selected different degrees of intermixing such that at least two guided areas of said active region generate different wavelengths of laser light.

12. The laser diode array of claim 10 wherein said cavity means comprises front and rear arrays of periodic reflectors, each reflector tuned to feedback lightwaves having the same wavelength as said light emission wavelength of a corresponding area of said active region.

13. The laser diode array of claim 10 wherein said means for pumping is individually addressable of each area of said active region.

14. The device of claim 1 wherein said optical gain medium includes a laser oscillator section defined in a rear portion of the medium and an optical power amplifier section defined in a front portion of the medium in tandem with the laser oscillator section, said laser oscillator section having resonant cavity means for providing feedback for each area in the rear portion of said composite active region of lightwaves generated in each said area, areas of said amplifier section in the front portion of said composite active region being optically coupled to corresponding areas in said rear portions to receive lightwaves from said laser oscillator section, said corresponding areas in said front and rear portions of said active medium having substantially the same degree of intermixing and substantially the same amplification wavelength band.

15. The device of claim 1 further comprising means disposed on said substrate in front of said optical gain medium for doubling the frequency of light emitted from at least one area of said active region.

16. The laser diode array of claim 15 wherein said means for doubling the frequency of light comprises a ferroelectric waveguide array formed on said substrate, said ferroelectric waveguide array having at least one periodically poled waveguide.

17. A multi-wavelength laser diode array comprising,
    a substrate,
    a plurality of contiguous semiconductor layers forming a heterostructure disposed on said substrate, said heterostructure including at least two adjacent lower bandgap layers together sandwiched between higher bandgap barrier layers forming a composite active region, said at least two adjacent lower bandgap layers having been formed from adjacent quantum well layers that were subsequently partially intermixed in at least one of their atomic species in at least one area of said active region to have a different light emission wavelength than other areas of said active region,
    means for pumping each area of said active region, and
    cavity means for providing feedback for each said area of said active region of lightwaves generated in said areas.

18. The laser diode array of claim 17 wherein said at least two adjacent lower bandgap layers of said composite active region have been formed from adjacent group III-V compound semiconductor material quantum well layers of dissimilar composition but similar bandgap, the resultant adjacent lower bandgap layers also having dissimilar composition but with dissimilar bandgaps.

19. The laser diode array of claim 18 wherein said at least one partially intermixed area of said at least two adjacent lower bandgap layers of said active region is intermixed in its constituent group III atomic species.

20. The laser diode array of claim 18 wherein said at least one partially intermixed area of said at least two adjacent lower bandgap layers of said active region is intermixed in its constituent group V atomic species.

21. The laser diode array of claim 17 wherein said active region has a plurality of laterally spaced apart areas with different light emission wavelengths.

22. The laser diode array of claim 17 wherein said cavity means comprises front and rear arrays of periodic reflectors, each reflector tuned to feedback lightwaves having the same wavelength as said light emission wavelength of a corresponding area of said active region.

23. The laser diode array of claim 17 wherein said means for pumping is individually addressable of each area of said active region.

24. The laser diode array of claim 17 further comprising harmonic generating means integrally formed on said substrate in front of said cavity means for converting the frequency of light emitted from at least one area of said active region to a harmonic of said frequency.

25. The laser diode array of claim 24 wherein said harmonic generating means comprises an electrically polarized ferroelectric waveguide array formed on said substrate.

26. The laser diode array of claim 25 wherein said ferroelectric waveguide array is composed of a three layer $Ca_xSr_{1-x}F_2/LiTaO_3/Ca_xSr_{1-x}F_2$ material sandwich deposited on a (111) GaAs surface of said substrate.

27. The laser diode array of claim 25 wherein said ferroelectric waveguide array is composed of a three layer $MgO/BaTiO_3/MgO$ material sandwich deposited on a (100) GaAs surface of said substrate.

28. The laser diode array of claim 25 wherein said ferroelectric waveguide array is composed of a ferroelectric material waveguide core layer sandwiched between a lower cladding layer formed epitaxially on said substrate and an upper cladding formed over said waveguide core layer, said lower cladding layer and said upper cladding being composed of material having a lower refractive index than said ferroelectric material waveguide core layer.

29. The laser diode array of claim 25 wherein said ferroelectric waveguide array has at least one periodically poled waveguide.

30. The laser diode array of claim 29 wherein said at least one periodically poled waveguide has a first-order quasi-phase matched domain period.

31. The laser diode array of claim 29 wherein said at least one periodically poled waveguide has a third-order quasi-phase matched domain period.

32. A monolithic multi-wavelength laser diode array comprising
a semiconductor material body having a plurality of contiguous semiconductor layers forming a heterostructure, said heterostructure including a composite active region with two adjacent quantum well layers of dissimilar materials sandwiched between two higher bandgap confinement layers, said heterostructure also including means for guiding propagation of lightwaves within an array of laterally spaced apart regions, said composite active region having been partially disordered such that constituent atomic species of said two adjacent quantum well layers have been mixed to different specified degrees in said spaced apart regions of said array, each of said spaced apart regions characterized by a gain wavelength band that is different from that of at least one other spaced apart region in said array,
excitation means for pumping said partially disordered composite active region so that said active region in each of said spaced apart regions of said array generates lightwaves having a wavelength within said characteristic gain wavelength band that is different than a wavelength of lightwaves generated by said active region in at least one other spaced apart region of said array, and
resonant cavity means for providing feedback of lightwaves propagating in said array of spaced apart regions.

33. The laser diode array of claim 32 wherein said resonant cavity means includes at least one grating reflector associated with each spaced apart region of said array.

34. The laser diode array of claim 33 wherein each said grating reflector is tuned to reflect the lightwaves generated by the active region that have a wavelength characteristic of the particular spaced apart region of the array with which that grating reflector is associated.

35. The laser diode array of claim 32 wherein said active region and said array of spaced apart regions extend beyond said resonant cavity means to form a power amplifier integral with the laser array for amplifying lightwaves emitted from said resonant cavity means.

36. The laser diode array of claim 35 further comprising harmonic generation means receiving said amplified lightwaves for doubling the frequencies of lightwaves from at least one of said spaced apart regions of said array.

37. The laser diode array of claim 36 wherein said harmonic generation means comprises ferroelectric material waveguides monolithically integrated with said semiconductor material body.

38. The laser diode array of claim 37 wherein at least one of said ferroelectric material waveguides is periodically poled.

39. The laser diode array of claim 32 wherein said active region has been formed from an InGaP quantum well layer and a GaAlAs quantum well layer.

40. The laser diode array of claim 39 wherein said In, Ga and Al (Group III) atoms in said quantum well layers have been mixed to different degrees, said active region thereby comprising adjacent InGaAlP and InGaAlAs quantum well layers of varying composition in different spaced apart regions of said array.

41. The laser diode array of claim 39 wherein said As and P (Group V) atoms in said quantum well layers have been mixed to different degrees, said active region thereby comprising adjacent InGaAsP and GaAlAsP quantum well layers of varying composition in different spaced apart regions of said array.

42. The laser diode array of claim 32 wherein said excitation means comprises a plurality of laterally spaced apart, individually addressable means for injecting current into each of said spaced apart regions of said array.

43. A monolithic frequency-converted laser comprising,
a substrate,
a diode laser formed on said substrate, wherein said diode laser is a multiwavelength laser array having a plurality of laterally spaced apart light emitting elements with at least two light emitting elements emitting light of different frequencies, and a harmonic generator composed of ferroelectric material integrally formed on the same said substrate as said diode laser, said harmonic generator being a ferroelectric waveguide array having a plurality of laterally spaced apart ferroelectric waveguides optically coupled to corresponding light emitting elements of said laser array for converting the different frequencies of light received from said multiwavelength laser array to harmonics of those frequencies, wherein at least one ferroelectric waveguide of said ferroelectric waveguide array is periodically poled with a domain period corresponding to the frequency of light received from the corresponding light emitting element of the laser array.

44. The monolithic device of claim 43 wherein each periodically poled waveguide has a first-order quasiphase matched domain period.

45. The monolithic device of claim 43 wherein each periodically poled waveguide has a third-order quasiphase matched domain period.

46. A monolithic frequency-converted laser comprising, a substrate, a diode laser formed on said substrate, wherein said diode laser is a multiwavelength laser array having a plurality of laterally spaced apart light emitting elements with at least two light emitting elements emitting light of different frequencies, and a harmonic generator composed of ferroelectric material integrally formed on the same said substrate as said diode laser, said harmonic generator being a ferroelectric waveguide array having a plurality of laterally spaced apart ferroelectric waveguides optically coupled to corresponding light emitting elements of said laser array for converting the different frequencies of light received from said multiwavelength laser array to harmonics of those frequencies, wherein said ferroelectric waveguide array is composed of ferroelectric material waveguide core layer sandwiched between a lower cladding layer formed epitaxially on said substrate and an upper cladding formed over said waveguide core layer, said lower cladding layer and said upper cladding being composed of material having a lower refractive index than said ferroelectric material waveguide core layer, and wherein said material of the ferroelectric waveguide array is composed of a three layer $Ca_xSr_{1-x}F_2/LiTaO_3/Ca_xSr_{1-x}F_2$ sandwich deposited on a (111) GaAs surface of said substrate.

47. The monolithic device of claim 46 wherein said $Ca_xSr_{1-x}F_2$ lower cladding layer of said three layer sandwich has a graded composition which is lattice-matched to said GaAs substrate and to said $LiTaO_3$ waveguide core layer.

48. A monolithic frequency-converted laser comprising, a substrate, a diode laser formed on said substrate, wherein said diode laser is a multiwavelength laser array having a plurality of laterally spaced apart light emitting elements with at least two light emitting elements emitting light of different frequencies, and a harmonic generator composed of ferroelectric material integrally formed on the same said substrate as said diode laser, said harmonic generator being a ferroelectric waveguide array having a plurality of laterally spaced apart ferroelectric waveguides optically coupled to corresponding light emitting elements of said laser array for converting the different frequencies of light received from said multiwavelength laser array to harmonics of those frequencies, wherein said ferroelectric waveguide array is composed of a ferroelectric material waveguide core layer sandwiched between a lower cladding layer formed epitaxially on said substrate and an upper cladding formed over said waveguide core layer, said lower cladding layer and said upper cladding being composed of material having a lower refractive index than said ferroelectric material waveguide core layer, and wherein said material of the ferroelectric waveguide array is composed of three layer $MgO/BaTiO_3/MgO$ sandwiched deposited on a (100) GaAs surface of said substrate.

49. A monolithic frequency-converted laser comprising, a substrate, a diode laser formed on said substrate, wherein said diode laser is multiwavelength laser array having a plurality of laterally spaced apart light emitting elements with at least two light emitting elements emitting light of different wavelengths, and wherein said multiwavelength diode laser array has a composite active region of at least two adjacent lower bandgap semiconductor layers which have been at least partially intermixed in at least one of their atomic species to different selected degrees in plural areas of said composite active region and which are together sandwiched between higher bandgap barrier layers, the degree of intermixing in each area determining a wavelength band for amplification of lightwaves propagating in that area, and a harmonic generator composed of ferroelectric material integrally formed on the same said substrate as said diode laser, said harmonic generator including at least one ferroelectric waveguide optically coupled to said diode laser for converting the frequency of light received from said diode laser to a harmonic of said frequency.

50. A monolithic frequency-converted laser comprising, a substrate, a diode laser formed on said substrate, said diode laser having a quantum well active region structure with at least two adjacent lower bandgap layers together sandwiched between higher bandgap barrier layers, said adjacent lower bandgap layers having been at least partially intermixed in at least one of their constituent atomic species, the degree of intermixing determining an emission wavelength for said diode laser, and a harmonic generator composed of ferroelectric material integrally formed on the same said substrate as said diode laser, said harmonic generator including at least one ferrroelectric waveguide optically coupled to said diode laser for converting the frequency of light received from said diode laser to a harmonic of said frequency.

51. A method of making a device for emitting light comprising, disposing a plurality of semiconductor layers on a substrate to form a diode heterostructure with a composite active region, said composite active region including adjacent quantum well layers together sandwiched between higher bandgap layers, at least partially intermixing at least one constituent atomic species of said adjacent quantum well layers to a selected degree in at least one area of said composite active region to form two adjacent lower bandgap layers between said higher bandgap layers, the degree of intermixing between said adjacent quantum well layers determining, in at least one of the resultant adjacent lower bandgap layers, a wavelength band for generation of lightwaves in that area, and providing means for exciting each area of said active region to produce said lightwave generation.

52. The method of claim 51 wherein said adjacent quantum well layers are of dissimilar composition but similar bandgap, and the resultant adjacent lower bandgap layers formed by said intermixing also have dissimilar composition but more dissimilar bandgaps than that of said quantum well layers.

53. The method of claim 52 wherein said adjacent quantum well layers are group III-v compound semiconductor material layers and are intermixed in their constituent group III atomic species.

54. The method of claim 52 wherein said adjacent quantum well layers are group III-V compound semiconductor material layers and are intermixed in their constituent group V atomic species.

55. The method of claim 52 wherein said adjacent quantum well layers are composed of InGaP and GaAlAs and the resultant adjacent lower bandgap layers formed by said intermixing are a reduced bandgap InGaAlAs layer and an increased bandgap InGaAlP layer.

56. The method of claim 54 wherein said adjacent quantum well layers are composed of InGaP and GaAlAs and the resultant adjacent lower bandgap layers formed by said intermixing are a reduced bandgap GaAlAsP layer and an increased bandgap InGaAsP layer.

57. The method of claim 51 wherein different areas of said composite active region are intermixed to different degrees such that said different areas form at least two spaced apart active guided areas which when excited by said provided exciting means generate different wavelengths of light.

* * * * *